United States Patent
Werner et al.

(10) Patent No.: US 7,119,358 B2
(45) Date of Patent: Oct. 10, 2006

(54) SEMICONDUCTOR STRUCTURE FOR USE IN THE NEAR INFRARED REGION AND A METHOD OF MANUFACTURING THIS SEMICONDUCTOR STRUCTURE

(75) Inventors: Peter Werner, Halle (DE); Viatcheslav Egorov, St. Petersburg (RU); Vadim Talalaev, St. Petersburg (RU); George Cirlin, St. Petersburg (RU); Nikolai Zakharov, Halle (DE)

(73) Assignee: Max-Planck-Gesellschaft zur Forderung der Wissenschaften e.V., (DE)

( * ) Notice: Subject to any disclaimer, the term of this patent is extended or adjusted under 35 U.S.C. 154(b) by 0 days.

(21) Appl. No.: 10/723,285

(22) Filed: Nov. 25, 2003

(65) Prior Publication Data
US 2004/0140531 A1    Jul. 22, 2004

(30) Foreign Application Priority Data
Nov. 29, 2002    (EP)    ................................. 02026698

(51) Int. Cl.
*H01L 29/06*    (2006.01)
(52) U.S. Cl. .............................. 257/15; 257/17; 257/19
(58) Field of Classification Search ............. 257/12–19, 257/190–191
See application file for complete search history.

(56) References Cited

U.S. PATENT DOCUMENTS

| | | | | |
|---|---|---|---|---|
| 4,679,061 A | * | 7/1987 | Capasso et al. ............... | 257/21 |
| 4,959,694 A | | 9/1990 | Gell ............................ | 357/16 |
| 5,198,682 A | * | 3/1993 | Wu et al. ..................... | 257/21 |
| 5,399,880 A | * | 3/1995 | Chand ......................... | 257/21 |
| 5,917,195 A | | 6/1999 | Brown ......................... | 257/22 |
| 6,154,475 A | * | 11/2000 | Soref et al. ................... | 372/45 |
| 6,403,975 B1 | | 6/2002 | Brunner et al. ............... | 257/15 |
| 6,621,841 B1 | * | 9/2003 | Soref et al. ................... | 372/43 |

FOREIGN PATENT DOCUMENTS

| | | |
|---|---|---|
| DE | 102 07 952 A1 | 9/2003 |
| EP | 1 178 522 A1 | 2/2002 |

OTHER PUBLICATIONS

Schmidt, et al., Resonant Tunneling Diodes Made Up of Stacked Self-Assembled GE/SI Islands, Applied Physics Letters, American Institute of Physics, vol. 77, No. 26, pp. 4341-4343, Dec. 25, 2000.

(Continued)

*Primary Examiner*—Sara Crane
(74) *Attorney, Agent, or Firm*—Sierra Patent Group, Ltd.

(57) ABSTRACT

The invention relates to a semiconductor structure for use in the near infrared region, preferably in the range from 1.3 to 1.6 μm, said structure comprising an active zone consisting of a plurality of epitaxially grown alternating layers of Si and Ge, a base layer of a first conductivity type disposed on one side of said active zone, and a cladding layer of the opposite conductivity type to the base layer, the cladding layer being provided on the opposite side of said active zone from said base layer, wherein the alternating Si and Ge layers of said active zone form a superlattice so that holes are located in quantized energy levels associated with a valance band and electrons are localized in a miniband associated with the conduction band and resulting from the superlattice structure. The invention is also directed to a method of manufacturing aforementioned structure.

14 Claims, 10 Drawing Sheets

OTHER PUBLICATIONS

Liu, et al., Observation of Inter-Sub-Level Transitions in Modulation-Doped GE Quantum Dots, Applied Physics Letters, American Institute of Physics, vol. 75, No. 12, pp. 1745-1747, Sep. 20, 1999.

Deutschmann, et al., Miniband Transport in Vertical Superlattice Field-Effect Transistors, Applied Physics Letters, American Institute of Physics, vol. 79, No. 10, pp. 1564-1566, Sep. 3, 2001.

Brunner, et al., GE Quantum Dots in SI: Self-Assembly, Stacking and Level Spectroscopy, Physica E 13, pp. 1018-1021, 2002.

Goryll, et al., Morphology and Photoluminescence of GE Islands Grown on SI (001), Thin Solid films 336, Elsemvier Science S.A., pp. 244-247, 1998.

Schmidt, et al., Effect of Overgrowth Temperature on the Photoluminescence of GE/SI Islands, Applied Physics Letters, American Institute of Physics, vol. 77, No. 16, pp. 2509-2511, Oct. 16, 2000.

Eberl, et al., Self-Assembling SIGE and SIGEC Nanostructures for Light Emitters and Tunneling Diodes, Thin Solid Films 369, Elsevier Science S.A., pp. 33-38, 2000.

Scamarcio, et al., Tunable Interminiband Infrared Emission in Superlattice Electron Transport, Applied Physics Letters, American Institute of Physics, pp. 1796-1798, Apr. 7, 1997.

O.G. Schmidt, et al., Multiple Layers of Self-Assembled GE/SI Islands: Photoluminescence, Strain Fields, Material Interdiffusion, and Island Formation, Physical Review B, The American Physical Society, vol. 61, No. 20, pp. 13721-13729, May 15, 2000.

Manfred Helm, Topical Review, Infrared Spectroscopy and Transport of Electrons in Semiconductor Superlattices, Semiconductor Science Technology 10, pp. 557-575, 1995.

European Search Report, Jul. 14, 2003.

Peter Schittenhelm, "Selected Topics of Semiconductor Physics and Technology", vol. 2, Eds: G. Abstreiter, M. Stutzmann, P. Vogl, Jun. 1997, Two-Page English Summary (ISBN: 3-932749-02-2).

L. Colace et al., "Efficient high-speed near-infrared Ge photodetectors integrated on Si substrates", Applied Physics Letters, pp. 1231-1233, Mar. 6, 2000.

A.G. Cullis et al., "The structural and luminescence propereties of porous silicon", Applied Physics Reviews, pp. 909-965 Aug. 1, 1997.

H. Presting et al., "Room-temperature electroluminescence from Si/Ge/$Si_{1-x}Ge_x$ quantum-well diodes grown by molecular-beam epitaxy", Applied Physics Letters, pp. 2376-2378, Oct. 14, 1996.

T. Brunhes et al., "Electroluminescence of Ge/Si self-assembled quantum dots grown by chemical vapor deposition", Applied Physics Letters, pp. 1822-1824, Sep. 18, 2000.

E. Eberl et al., "Pseudomorphic $Si_{1-y}C_y$ and $Si_{1-x-y}Ge_xC_y$ alloy layers on Si", Thin Solid Films, pp. 98-104, 1997.

O.G. Schmidt et al., "Multiple layers of self-assembled Ge/Si islands: Photoluminescence, strain fields, material interdiffusion, and island formation", Physical Review B, pp. 721-729, May 15, 2000.

M. Goryll et al, "Morphology and photoluminescence of Ge islands grown on Si(001)", Thin Solid Films, pp. 244-247, 1998.

H. Sunamura et al., "Photoluminescence investigation on growth mode changeover of Ge on Si(100)", Journal of Crystal Growth, pp. 265-269, 1995.

O.G. Schmidt et al., "Effect of overgrowth temperature on the photoluminescence of Ge/Si islands", Applied Physics Letters, pp. 2509-2511, Oct. 16, 2000.

Y.Q. Wang et al., "High-efficiency visible photoluminescence from amorphous silicon nanoparticles embedded in silicon nitride," Applied Physics Letters, pp. 3474-3476, Oct. 27, 2003.

P. Werner et al., "Interface structure and Schottky barrier height of buried $CoSi_2$/Si(001) layers," J. Applied Physics, pp. 3846-3854, Sep. 15, 1993.

* cited by examiner

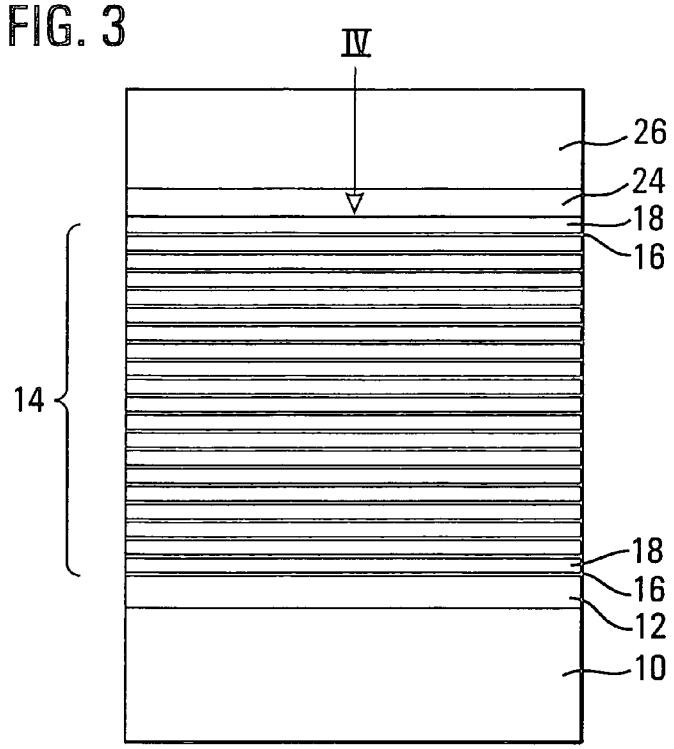
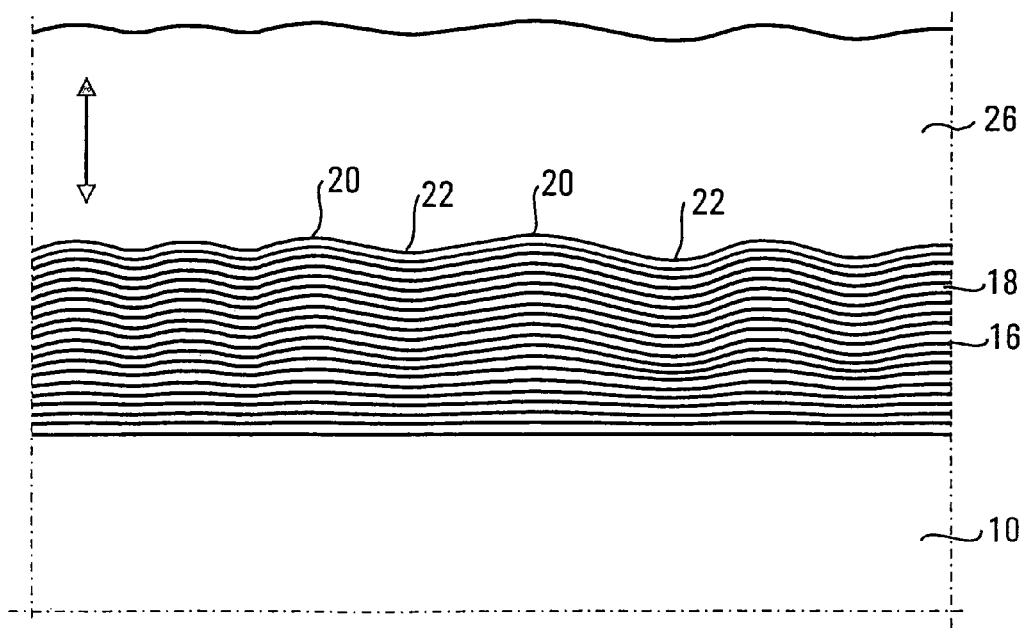

ATTACHMENT A

SEMICONDUCTOR STRUCTURE FOR USE IN THE NEAR INFRARED REGION AND A METHOD OF MANUFACTURING THIS SEMICONDUCTOR STRUCTURE

PRIORITY CLAIMED

This application claims filing date priority benefit to European Patent Application No. 02 026 698.7, filed Nov. 29, 2002.

BACKGROUND OF THE INVENTION

This invention relates to a semiconductor structure for use in the near infrared region, preferably in the wavelength range from 1.3 to 1.6 µm, and to a method of manufacturing a semiconductor structure of the aforementioned kind.

In the area of computers, telecommunications and fiber optics there is a need for optical circuits working in the near infrared region, i.e., in the range of wavelengths from 1.3 µm to 1.6 µm. Semiconductor devices operating in this wavelength region are generally known. Known emitters and detectors for use in this wavelength region typically comprise heterostructures made from III–V compound semiconductor based materials, for example GaAs, AlGaAs, or InGaAs. These heterostructures are of semiconductor type L i.e. they are characterized by a direct transition of the charge carriers from the conduction band CB to the valence band VB. The direct interband transition is indicated by the arrow in FIG. 1 which shows the energy band structure in momentum space of a type I semiconductor. Because of this direct interband transition, the recombination efficiency of carriers and, hence, the photoluminescent intensity are very high and the carrier lifetime typically is less than a few microseconds.

However, III–V heterostructure technology is very costly. Moreover, hazardous source materials are used in the production of such III–V heterostructures, for instance, if a metal oxide chemical vapour deposition (MOCVD) technique is used. It is therefore desirable to have emitters, for example light emitting diodes, and detectors based on silicon which is approximately two hundred times less expensive than III–V semiconductor material. Further, the integration of Si based emitters and detectors would allow the realization of efficient interconnects between Si-based integrated circuits and internal light sources. Thus optical communications would be possible between components of computers and telecommunications equipment avoiding heat dissipation problems associated with existing circuits.

In the case of infrared emitting circuits there is, however, a general problem. Silicon is namely a type II semiconductor, i.e. it is characterized by an indirect fundamental band gap between the conduction band $E_C$ and the valence band $E_V$ as can be seen from the energy band structure in momentum space which is shown in FIG. 2. The maximum of the valence band VB and the minimum of the conduction band CB are not directly opposite to each other, but rather a global minimum of the CB is at a value of wave vector $k \neq 0$. Due to the principle of conservation of momentum, an electron can recombine with a hole and emit a photon only through exchanging momentum with a third particle, such as a phonon. This recombination process is very rare in comparison with direct transitions in type I semiconductors. Therefore, the recombination efficiency of carriers and, thus, the photoluminescent intensity of Si based emitters is strongly reduced.

Many attempts have been made to develop new concepts of light emitting structures or detectors which can be incorporated in silicon technology. For example, infrared detectors basing on germanium on Si wafers have been investigated, see for example L. Colace et al., Appl. Phys. Lett. 76, 1231 (2000). Moreover, porous silicon has been analyzed (A. G. Cullis et al., J. Appl. Phys. 83, 909 (1997)). In addition, Si-Ge quantum well structures have been investigated (H. Presting et al., Appl. Phys. Lett. 69, 2376 (1996)), as well as quantum dot structures of SiGe (P. Schittenhelm, "Selbstorganisation und Selbstordnung in Si/SiGe-Heterostrukturen", in "Selected Topics of Semiconductor Physics", Eds: G. Abstreiter, M. Stutzmann, P. Vogl, TU München 1997, ISBN 3-932749-02-2). Moreover, carbon doped SiGe has been investigated, see T. Brunhes et al., Appl. Phys. Lett. 77, 1822 (2000) and K. Eberl et al., Thin Solid Films 294, 98 (1997). Furthermore, doping of silicon with centers for luminescence, for instance doping with erbium F. Priolo et al., "Excitation and nonradiative deexcitation process of $Er^{3+}$ in crystalline Si", Phys. Rev. B 57,4443 (1998), and silicon nanocrystals have been investigated.

However, for reasons such as low efficiency and operation only at low temperatures, none of the above mentioned systems has yet lead to a commercial product. It is only low dimensional semiconductor structures, in particular quantum dots (QD), which have attracted increasing interest from the point of view of fundamental physics and device application. For example, the strained SiGe/Si system has been subject of numerous investigations (O. G. Schmidt and K. Eberi, Phys. Rev. B61, 13721 (2000) an M. Goryll et al., Thin Solid Films 336, 244 (1998)). Optical properties of Ge islands have been widely studied and the complex transition and recombination phenomena in multi-layer structures have been analyzed. Photoluminescence of Si/Ge islands is generally obtained at low temperatures. Recently, some papers reported on room temperature photoluminescence originating from Si/Ge quantum dot structures (H. Sunamura et al., J. Cryst. Growth 157, 265 (1995) and O. G. Schmidt et al., Appl. Phys. Lett. 77, 2509 (2000)). However, no detailed investigations on the optical properties were presented.

SUMMARY

It is an object of the invention to provide a Si based semiconductor structure for use in the near infrared region having a recombination efficiency and photoluminescent intensity close to that of a type I heterostructure. It is another object of the invention to provide a simple method of manufacturing a semiconductor structure of the aforementioned kind.

The first object is met by a semiconductor structure. More specifically, the semiconductor structure of the invention is for use in the near infrared region, preferably in the range from 1.3 to 1.6 µm, and has an active zone consisting of a plurality of epitaxially grown alternating layers of Si and Ge; a base layer of a first conductivity type disposed on one side of said active zone; and a cladding layer of the opposite conductivity type to the base layer, the cladding layer being provided on the opposite side of said active zone from said base layer. The structure is characterized in that the alternating Si and Ge layers of said active zone form a superlattice so that holes are located in quantized energy levels associated with a valance band and electrons are localized in a miniband associated with the conduction band and resulting from the superlattice structure.

The inventors have discovered that by forming a superlattice of alternating Si and Ge layers it is possible to control the energy band structure of the Si based structure such that holes can be localized in quantum wells or quantum dots and electrons can freely move in a miniband adjacent the conduction band. Surprisingly, the Si based semiconductor structure of the invention has light emitting properties similar to those of III–V heterostructures.

Measurements have shown that carrier lifetimes in the structure of the invention are shorter than 10 μs. This is an extremely low value for a structure made from type II semiconductor material. In fact, carrier lifetimes of a few microseconds are typical of type I semiconductors. Hence, the semiconductor structure of the invention shows interband transition behavior at least similar to direct interband transitions. As a result, the semiconductor structure of the invention shows a photoluminescent intensity which is only insignificantly lower than that of a III–V heterostructure emitter. In addition, due to the use of Si technology, the structure of the invention is less expensive than a similar device made from III–V semiconductor material by a factor of approximately 200. Hence, a Si based emitter comprising the structure of the invention is well suited for use in computers, telecommunications equipment and fiber optic systems.

In a preferred embodiment of the semiconductor structure a dopant material is incorporated into the alternating layers of the active zone so that a doping gradient is realized in the superlattice. The doping gradient causes a bending of the energy band structure due to which electrons are confined in the active zone of the structure. This results in increased photoluminescent intensity.

At least one barrier layer may be provided between a side of the active zone and the base layer and/or the cladding layer at which the doping density is highest. A barrier layer between the active zone and the cladding layer prevents the electrons confined in the active zone from drifting into the cladding layer. Hence, the electrons are confined in the active zone even more effectively and the photoluminescent intensity is further increased.

According to another preferred embodiment of the invention the Ge layers of the active zone each comprise a relatively thin layer of germanium material and substantially regularly spaced apart islands or accumulations of germanium, each island having a relatively greater thickness than the thin layer, the islands forming quantum dots providing the quantized energy levels for said holes. Due to entrapment of holes in the islands the holes are localized at predetermined locations. As a result, the photoluminescent intensity plotted as a function of photon energy shows a minimum peak width at half height. Although the physics of the interaction of quantum dots and miniband is not yet fully understood, the inventors believe that the entrapment of holes in quantum dots also enhances the direct transition between miniband and valence band.

Preferably, the germanium layers each have an average thickness in the range between 0.7 nm and 0.9 nm. An average thickness in this range leads to a particularly good island growth and to a particularly effective formation of quantum dots. As a result, maximum photoluminescent intensity is achieved.

The highest doping density in the active zone may approximately be $10^{18}$ cm$^{-3}$ and the lowest doping density in the active zone may approximately be $5 \times 10^{16}$ cm$^{-3}$. These doping densities produce a doping gradient in the active zone which results in effective electron confinement in the active zone and, hence, in maximum photoluminescence intensities.

Preferably, the dopant is Sb or P for n-type Si and B or In for p-type Si. Antimony stimulates island growth and also smoothes the surface of the layer to be grown.

The active zone should comprise at least 12 alternating layers and, preferably, not more than 30 alternating layers. Fewer than 12 alternating layers are not sufficient to generate an electrical miniband. More than 30 layers are difficult to grow without creating defects, such as secondary islands or inhomogeneities, in the active zone which act as recombination centers and deteriorate the performance of the structure.

The active zone advantageously comprises from 15 to 25 alternating layers. With this number of layers a particularly effective superlattice and, thus, maximum photoluminescent intensity is achieved.

The second object of the invention is met by the method, which relates to a method of manufacturing a semiconductor structure in accordance with the invention comprising the steps of:

epitaxially growing an alternating sequence of Si and Ge layers on a base layer having the same crystal structure and at least almost the same lattice constant as Si, maintaining the temperature of the structure during growth to be in the range of 400° C. to 650° C. and preferably between 425° C. and 550° C., each said Ge layer being grown at a growth rate of at least 0.02 nm/s but not higher than 2 nm/s, growing each Si layer at a growth rate of at least 0.05 nm/s but not higher than 4 nm/s, and growing the cladding layer at a rate of at least 0.05 nm/s but not higher than 4 nm/s.

The high growth rates of the Ge and Si layers and of the cladding layer reduce the total process time of manufacturing the semiconductor structure, preventing unwanted interdiffusion of the different materials. The high growth temperature moreover simultaneously aids the healing of any lattice defects that may occur. Lattice defects are particularly problematic because they lead to undesired non-radiating recombination of holes and electrons. It is particularly favorable that the growth of Ge islands is enhanced in the Ge layers of the active zone as a result of these high growth rates. This leads to the formation of morphologically flat quantum dots for the holes interacting with the miniband for the electrons due to the superlattice being enhanced, thereby increasing the recombination efficiency and, thus, the PL intensity of the emitter.

By maintaining the temperature of the structure during growth to be in the range of 400° C. to 650° C. and preferably between 425° C. and 550° C., defects, in particular point defects, occurring at the above mentioned high growth rates can efficiently be annealed in situ. Therefore, no additional annealing step is necessary at the end of the manufacturing process of the structure. Instead, possibly occurring point defects are annealed right away during layer growth of the structure.

According to a preferred embodiment of the method of the invention regularly spaced apart islands or accumulations of germanium in the Ge layers due to inherent stress as a result of lattice misfit of a Ge layer and a Si layer are grown, said islands acting as quantum dots providing the quantized energy levels for the holes. This process of island growth is also known as Stranski-Krastanow growth and may be carried out without any additional photolithography or nanoimprint steps for the definition of the pattern in which islands are to be grown. The island growth is purely self-organized. Electron photolithography and nanoimprint techniques can however also be used to initiate island growth in accordance with the present teaching.

BRIEF DESCRIPTION OF THE DRAWINGS

Preferred embodiments of the invention are described in the following description and in the accompanying drawings, wherein:

FIG. 3 shows a schematic cross section through a semiconductor structure in accordance with the invention;

FIGS. 4 and 5 show images obtained by transmission electron microscopy of the cross section of the superlattice of the structure of FIG. 3;

DETAILED DESCRIPTION

Figure 1:
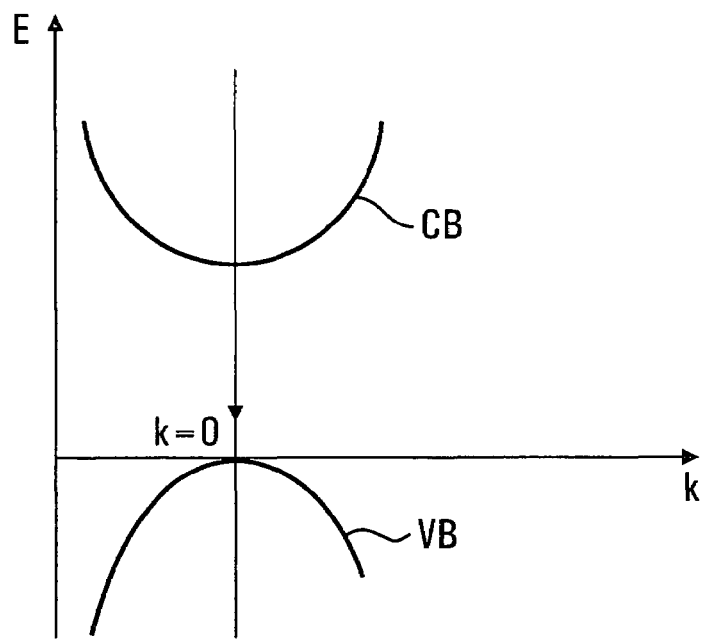
FIG. 1 shows an energy band structure in momentum space of a type I semiconductor.
Figure 2:
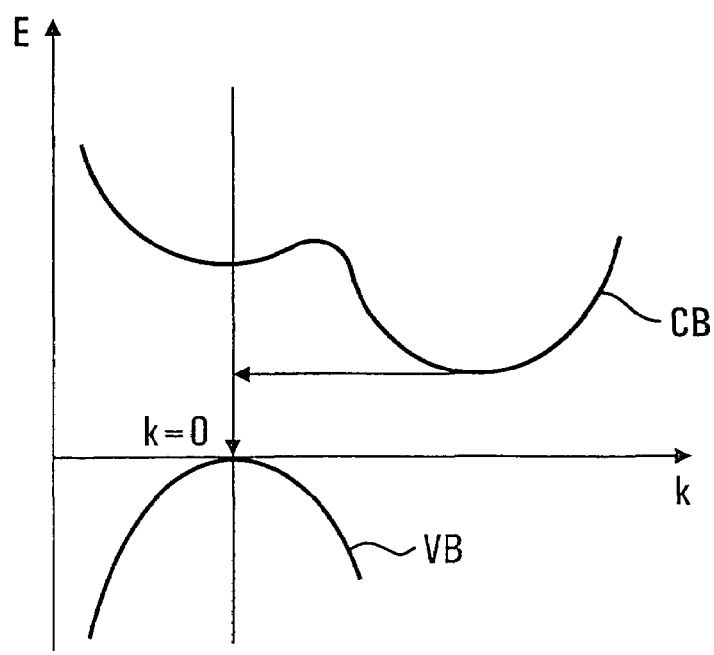
FIG. 2 shows an energy band structure in momentum space of a type II semiconductor.

FIG. 3 illustrates the semiconductor structure according to a preferred embodiment of the invention. By way of example, a light emitting structure will be described. However, a person skilled in the art will appreciate that a light emitter can generally also be used as a light detector requiring only slight modifications of the emitter structure well known in the art in order to optimize the efficiency of the detector.

The starting layer of the emitter structure shown in FIG. 3 is a base layer 10 which in this example comprises a silicon substrate, preferably a monocrystalline silicon wafer having a (100) orientation. Base layer 10 is of p-type conductivity with the dopant being boron or indium. Alternatively, base layer 10 can also be a (100)-silicon layer supported by a substrate made from a suitable foreign material.

On base layer 10 a Si buffer layer 12 made from intrinsic silicon and typically having a thickness of about 5 nm to 10 nm is epitaxially disposed.

On buffer layer 12 an active zone 14 is disposed which consists of a superlattice formed by 20 alternating layers of Ge and Si, each alternating layer comprising an epitaxially grown layer of Ge 16 and an epitaxially grown layer of Si 18. FIG. 3 shows that the superlattice starts with a first Ge layer 16. However, it is also possible to first dispose a Si layer 18 on the buffer layer 12.

Figure 5:
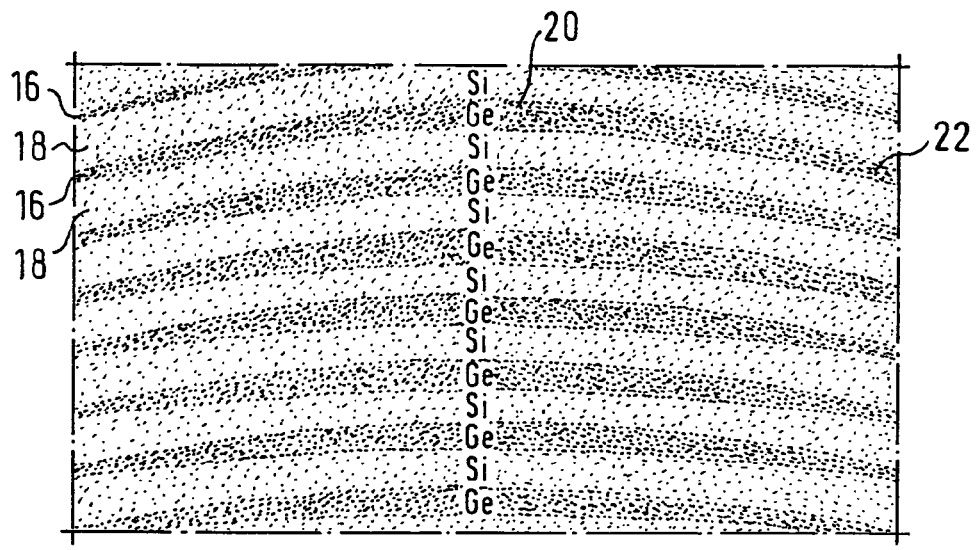

The Ge layers 16 each have an average thickness in the range between 0.7 nm and 0.9 nm, preferably of 0.8 nm. However, the layer thickness of the Ge layers 16 is not uniform throughout the lateral dimension of the Ge layers 16. Since the germanium lattice constant is greater than the silicon lattice constant by approximately 4%, inherent stress is caused in the Ge layers 16 by the lattice misfit between germanium and silicon. This inherent stress results in the formation of substantially regularly spaced apart islands 20 or accumulations of germanium material in the Ge layer 16, as shown in FIGS. 4 and 5. The islands 20 have a relatively greater thickness than a thin region of Ge material, also known as the wetting layer 22, surrounding the islands 20. This formation of islands is generally known as Stranski-Krastanov growth.

Between each two adjacent Ge layers 16 there is disposed a Si spacer layer 18 having an average thickness of less than 5 nm. The thickness of the Si spacer layer 18 also varies laterally. As can be seen in FIG. 5, the thickness of the Si layer 18 is a little less in the region of the Ge islands 20 than is it in the region of the wetting layer 22. The Ge islands 20 formed in each Ge layer 16 are aligned in the direction of epitaxial growth with the Ge islands 20 of the other Ge layers 16. As a result, the superlattice of the active zone 14 shows an undulation, as is best seen in FIG. 4. The total thickness of the active zone 14 is about 100 nm.

Figure 6:
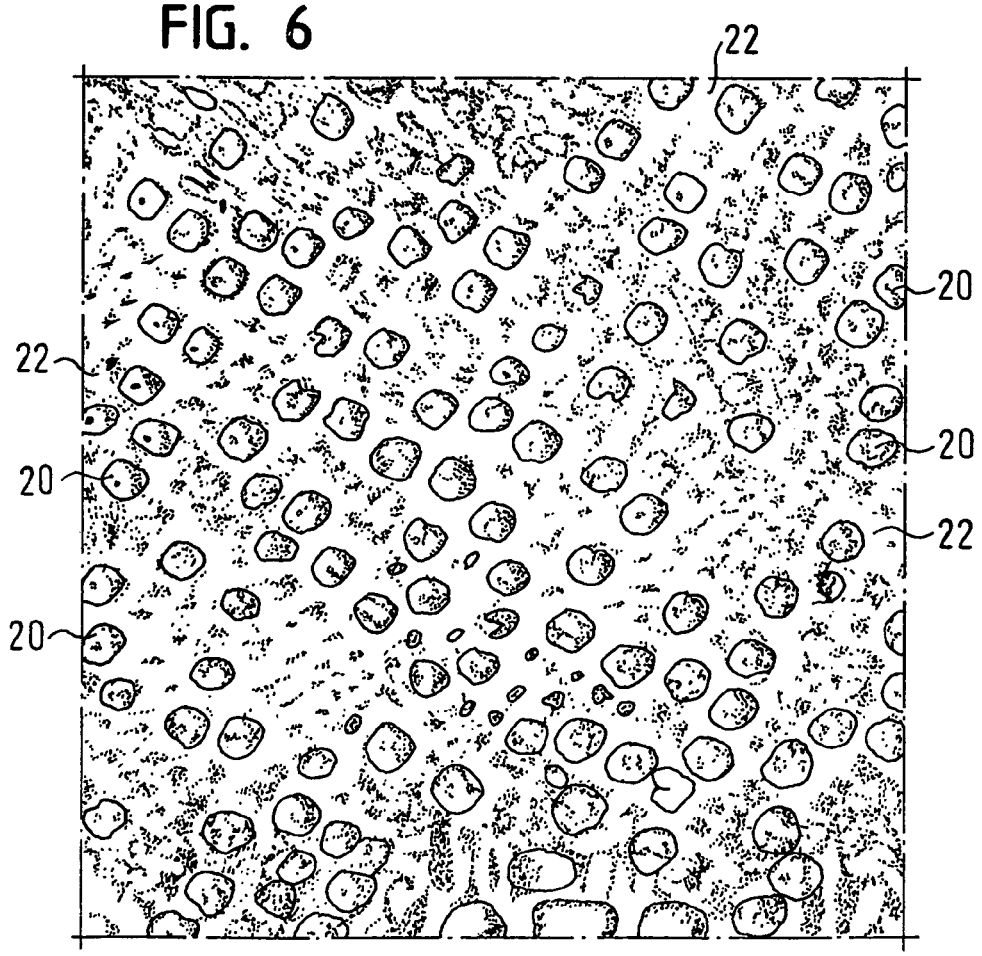
FIG. 6 shows an image obtained by transmission electron microscopy in the form of a plan view of the superlattice of FIG. 3 in accordance with arrow VI.

FIG. 6 illustrates the lateral distribution of Ge islands 20 formed by Stranski-Krastanov growth. The Ge islands 20 are substantially regularly spaced apart and the lateral density of the spaced apart Ge islands 20 is in the range of $10^{10}$ to $10^{11}$ $cm^{-2}$.

A barrier layer 24 is epitaxially disposed on the final layer of the superlattice of the active zone 14—this can either be a Si spacer layer 18 or a Ge layer 20. This barrier layer 24 consists of intrinsic or of n-type silicon. Alternatively, it can also comprise a silicon rich alloy of Si and Ge. The thickness of barrier layer 24 is about 10 nm.

A cladding layer 26 consisting of n-doped Si or slightly Ge alloyed Si, e.g. $Si_{0.98}Ge_{0.02}$, is epitaxially disposed on the barrier layer 24, said cladding layer 26 having a thickness of some 10 nm to some 100 nm but not greater than 1 μm. For electrically contacting the semiconductor structure suitable metal ohmic contacts—not shown in FIG. 3—can be disposed, for instance, on the base layer 10 and on the cladding layer 26. The cladding layer 26 could alternatively be realized as a metal silicide.

Figure 7:
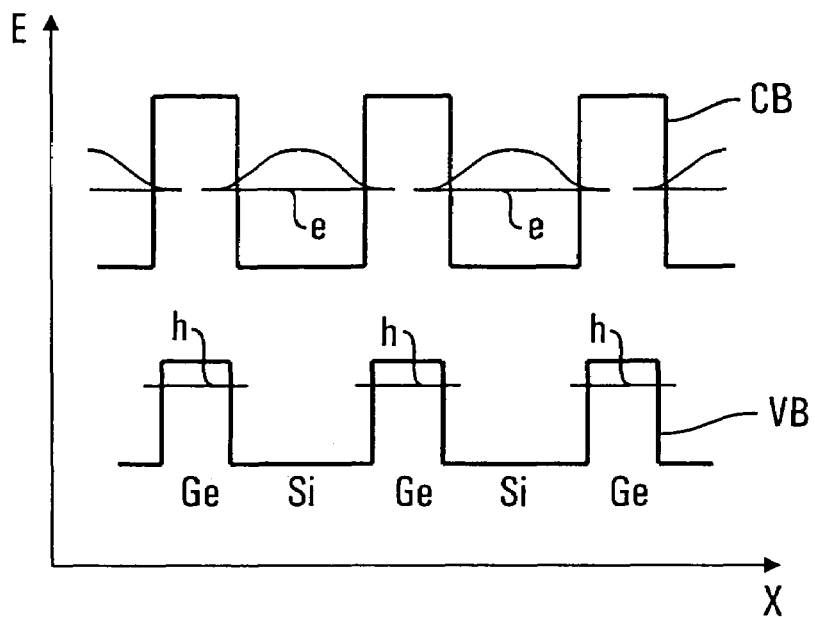
FIG. 7 shows an energy band structure in real space of a conventional multiple quantum well structure.
Figure 8:
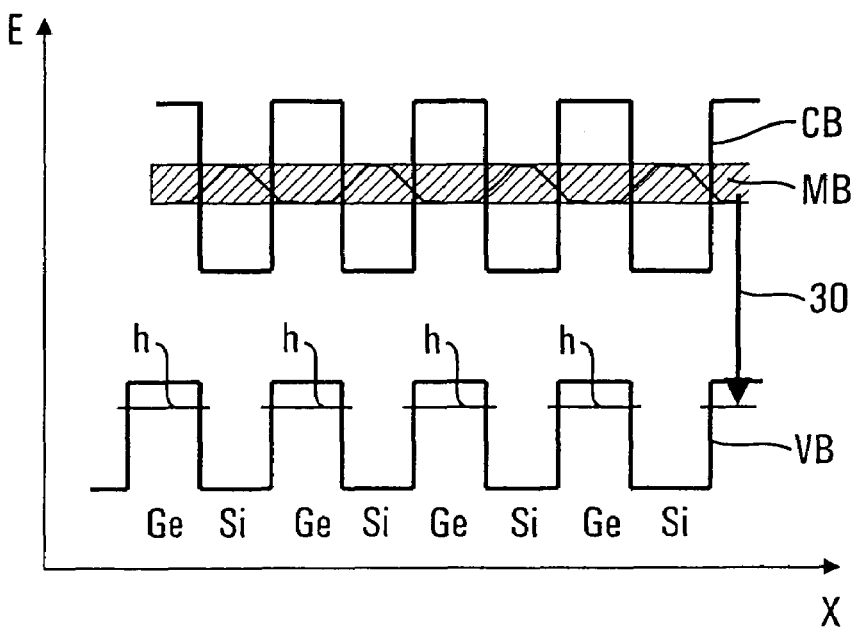
FIG. 8 shows an energy band structure in real space of a Si/Ge superlattice structure having a miniband.

With reference to FIG. 7 and FIG. 8, the electronic band structure of the Si/Ge superlattice structure will be described. FIG. 7 shows the energy bands in real space of a conventional multiple quantum well (or quantum dot) structure made from alternating layers of type II semiconductor material, in this case Si and Ge. The upper band is the conduction band CB and the lower band is the valence band VB. The ordinate represents the energy E and the abscissa represents the location X. The X axis indicates the direction of growth.

The Ge layers are spaced apart by Si spacer layers of a relatively great thickness, e.g. in the order of 10 nm to 50 nm. As a result, each Ge layer acts as a quantum well (or quantum dot) in which a hole is localized and each Si layer acts as a quantum well (or quantum dot) in which an electron is localized, as is indicated by the electronic states of the electrons e and of the holes h. Hence, neither holes nor electrons can move freely in the X-direction (or X- and Y-directions in case of quantum dots). The quantum wells for the holes and the electrons are not located directly opposite to each other but displaced sideways. Hence, electrons and holes can not recombine by a direct interband transition. Due to this, interband transitions are rare and the recombination efficiency and photoluminescence of this structure is low.

If the thickness of the Si spacer layers is reduced to, for instance, below 5 nm as in the structure of the invention, the holes still remain localized in the quantum wells or quantum dots formed by the Ge layers. However, for the electrons the periodic structure no longer consists of single quantum wells or quantum dots but has a miniband MB due to non-resonant tunnelling of electrons between the Si spacer layers. In other words, the periodic structure has overlapping electron wave functions.

The concept of "minibands" (or "zone folding") was first theoretically discussed for compound semiconductors (M. Helm, Semicond. Sci. Technol. 10, 557 (1995)) and later demonstrated experimentally for AlInAs/GaInAs (G. Scamarci et al., Appl. Phys. Lett 70, 1796 (1997) and R. D. Deutschmann et al., Appl. Phys. Lett. 79, 1564 (2001)).

In the Si/Ge superlattice structure of the invention the holes are localized in the Ge islands 20 acting as quantum dots whereas the electrons can move freely within the miniband MB. Hence, it is possible for an electron to exist directly opposite from a quantum dot in which a hole is trapped. This now permits electron hole recombination via a direct interband transition as indicated by arrow 30 in FIG. 8.

Figure 9:
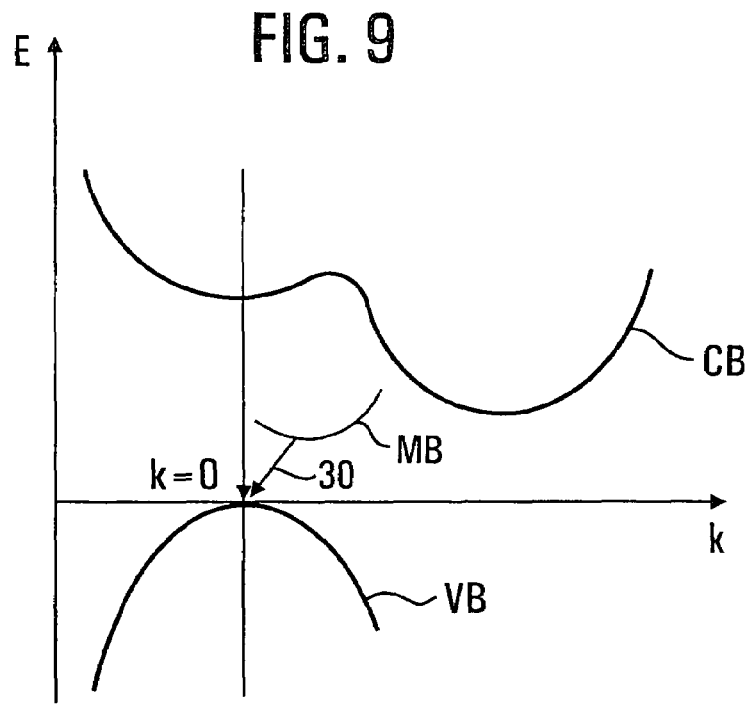
FIG. 9 shows the energy band structure in momentum space of the Si/Ge superlattice structure of FIG. 8 having a miniband.

FIG. 9 illustrates the electronic band structure of the Si/Ge superlattice in momentum space. The situation corresponds to that shown in FIG. 8. The ordinate represents the energy and the abscissa represents the wave vector k. The maximum of the valence band is located at k=0.

The conduction band CB of a conventional type II semiconductor such as Si or Ge has a local minimum at k=0 and an additional global minimum at k=0 which is lower than the local minimum at k=0. The characteristic interband transition does there fore not occur at k=0 but between the global minimum of the conduction band and the maximum of the valence band. Due to the principle of conservation of momentum this indirect transition involves a third particle, typically a phonon, and the recombination probability is low.

In case of miniband MB formation in the Si/Ge superlattice of the invention a new global minimum is created in the conduction band CB. This minimum state caused by the miniband MB is believed to be situated close to k=0. Lifetime measurements carried out by the inventors have surprisingly shown carrier lifetimes of less than 10 μs. This is a range of lifetime similar to that of direct semiconductors. So far experiments have not ruled out that the minimum due to the miniband 28 might even be at k=0.

Due to this additional minimum caused by the miniband MB, the Si/Ge superlattice structure behaves very similar to a direct semiconductor although it is made from indirect semiconductor material only. Because of the possibility of direct interband transitions—or at least transitions that are close to direct transitions—the recombination probability of electrons and holes is very high. Therefore an emitter having a high photoluminescence can be made from this Si/Ge superlattice structure, as will be discussed further below.

In order to further increase the recombination efficiency of the emitter, the active zone 14 of the semiconductor structure shown in FIG. 3 is provided with a doping gradient in the direction of growth. The doping of the active zone 14 is n-type and the dopant is antimony (Sb), although phosphorous is also possible. However, Sb is known to foster island growth in the Ge layer 16 and also smoothes the surface of the layer grown, i.e. it acts as a surfactant.

The lowest doping density in the active zone 14 is near the Si buffer layer 12 and about $5 \times 10^{16}$ cm$^{-3}$. The doping density increases across the active zone 14 in the direction of epitaxial growth to about $10^{18}$ cm$^{-3}$. The dopant Sb is introduced only during growth of the Si spacer layers 18. However, due to diffusion Sb also spreads into the Ge layers 16 such that a continuously increasing doping concentration of Sb is obtained in the doping zone 14.

Figure 10:
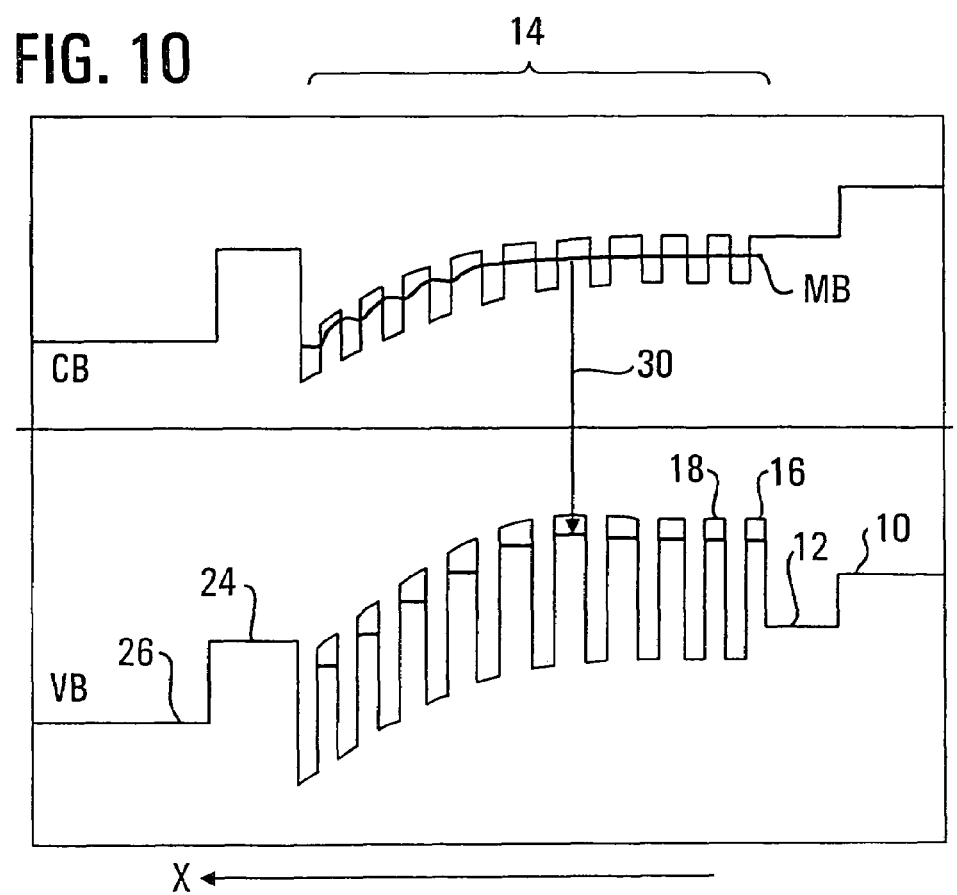
FIG. 10 shows an energy band structure in real space of the structure of FIG. 3 having a doping gradient in the active zone.

FIG. 10 shows the energy band gap structure in real space of the emitter of FIG. 3. The doping gradient results in a bending of the energy bands in the active zone 14. The conduction band CB and valence band VB bend towards lower energies at the side of the active zone 14 adjacent the cladding layer 26. Electrons moving into the active zone 14 from the cladding layer 26 therefore tend to drift along the active zone 14 towards the base layer 10. In order to prevent the electrons in the active zone 14 from moving out of the active zone 14 into the cladding layer 26 the barrier layer 24 is disposed between the active zone 14 and the cladding layer 26. Hence, the electrons are confined to the active zone 14 and the recombination probability of electrons and holes in the active zone 14 is further increased. As a result a higher photoluminescent intensity of the emitter is achieved.

In the semiconductor structure of FIG. 3, 20 alternating layers of Ge and Si form the superlattice of the active zone 14, each alternating layer consisting of a Ge layer 16 and a Si spacer layer 18. It is also conceivable to have somewhat fewer or somewhat more than 20 alternating layers. However, as has been explained above, the formation of a miniband MB for the electrons is a prerequisite for the functioning of the structure of the invention. For a miniband to form in a superlattice, a minimum number n of alternating layers of Ge and Si forming the superlattice are required.

Figure 11:
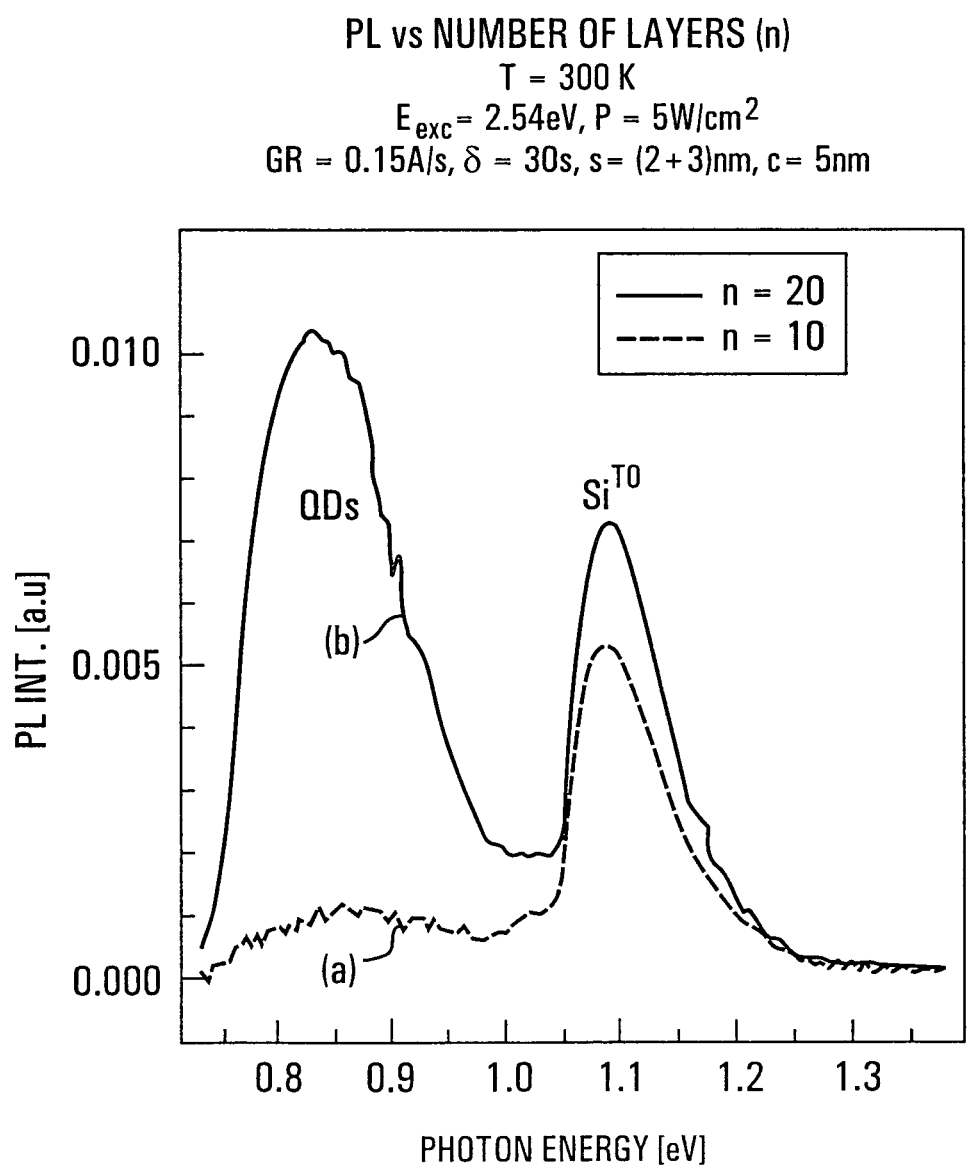
FIG. 11 is a graph showing the photoluminescent intensity as a function of photon energy for a) 10 and b) 20 alternating Si and Ge layers forming the superlattice of the structure of FIG. 3.

FIG. 11 shows the photoluminescence (PL) intensity in arbitrary units of the emitter of FIG. 3 as a function of photon energy in electron volts measured at 300 K, i.e. room temperature. The solid line represents an emitter having a superlattice of n=20 alternating layers and the broken line represents an emitter having a superlattice of n=10 alternating layers. Both lines show a peak at about 1.1 eV. This peak is typical for silicon material and corresponds to the indirect interband transition in silicon.

However, in contrast to the broken line, the solid line also shows a strong PL intensity peak at about 0.83 eV corresponding to the near infrared wavelength of about 1.5 μm. This peak is caused by radiating electron hole recombination due to the direct transition 30 between the miniband MB and the quantum dots as shown in FIG. 8 and FIG. 9. From this graph it can be seen that more than 10 alternating layers of Ge and Si, and preferably at least 15 alternating layers are necessary to form a miniband MB in a Si/Ge superlattice.

Further experiments have shown that the PL intensity does not increase significantly if many more than 25 alternating layers of Ge and Si are used to form the superlattice. In fact, the number of superlattice layers is limited by the ability to epitaxially grow layers that are substantially free of structural defects. A density of point defects not exceeding $10^{16}$ cm$^{-3}$ is believed to be harmless to the electrical properties of the emitter structure. However, apart from that any structural defect in the semiconductor structure acts as a center of recombination and, hence, significantly reduces the PL intensity. The inventors have found that it is extremely difficult to grow more than 30 alternating layers of Ge and Si by MBE without introducing a significant number of defects and/or inhomogeneities into the active zone 14. An optimum number of alternating layers of Ge and Si is therefore believed to be between 15 and 25.

Figure 12:
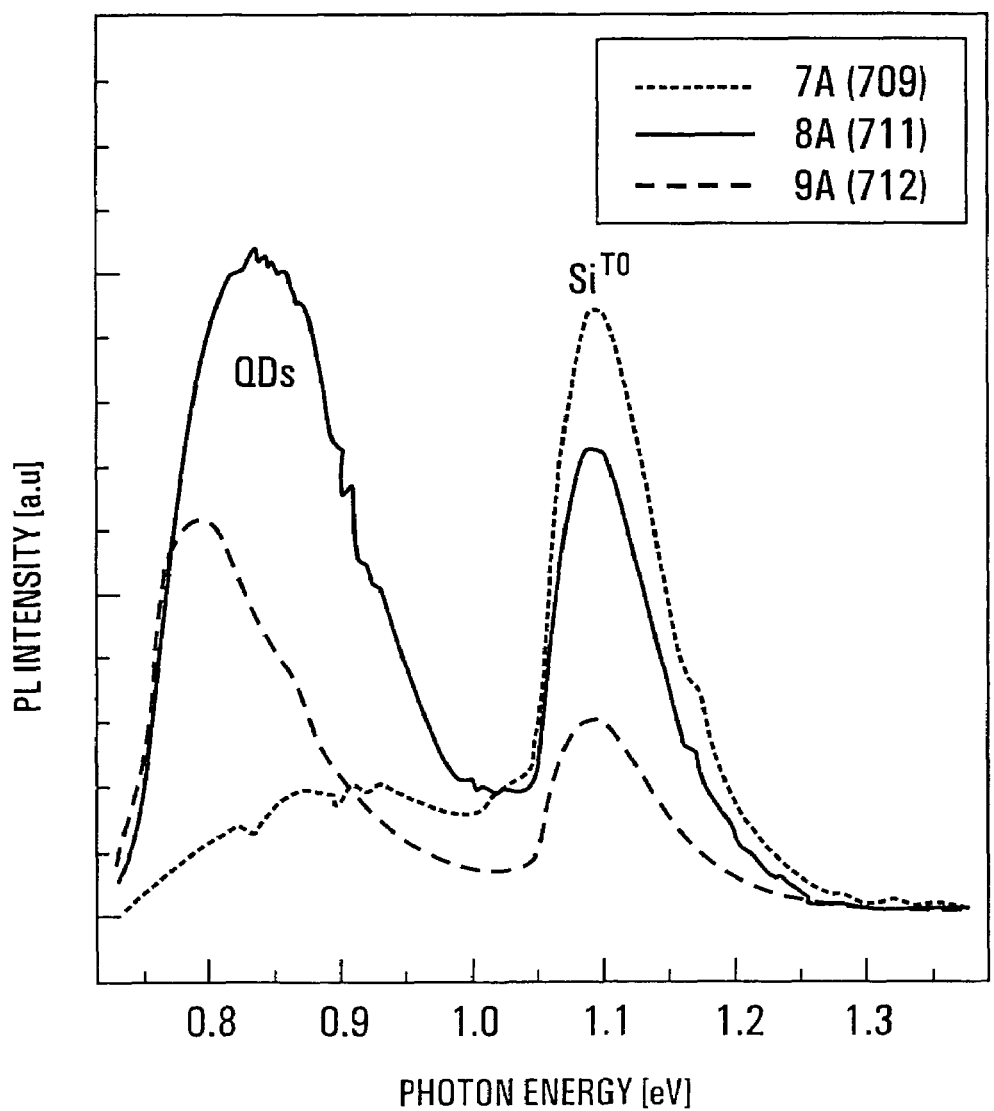
FIG. 12 is a graph showing the photoluminescent intensity as a function of photon energy for different layer thicknesses of germanium in the superlattice of the structure of FIG. 3.

The thickness of the Ge layers 16 also plays an important role for the miniband formation in the Si/Ge superlattice of the active zone 14. FIG. 12 shows the PL intensity of an emitter as a function of photon energy for three different Ge layer thicknesses. The dotted line represents an average thickness of 0.7 nm, the solid line of 0.8 nm and the broken line of 0.9 nm. The PL intensity of interest is the PL peak in the near infrared region, i.e. at about 0.83 eV. It can be seen in FIG. 12 that the emitter having a Ge layer thickness of 0.7 nm shows no PL peak at all at this wavelength. In contrast, the emitter having a Ge layer thickness of 0.9 nm has a significant PL peak at about 0.8 eV. The highest PL intensity in the near infrared range is achieved by a superlattice structure having a Ge layer thickness of 0.8 nm. Hence, an average thickness of the Ge layer 16 of 0.8 nm results in maximum recombination efficiency.

Figure 13:
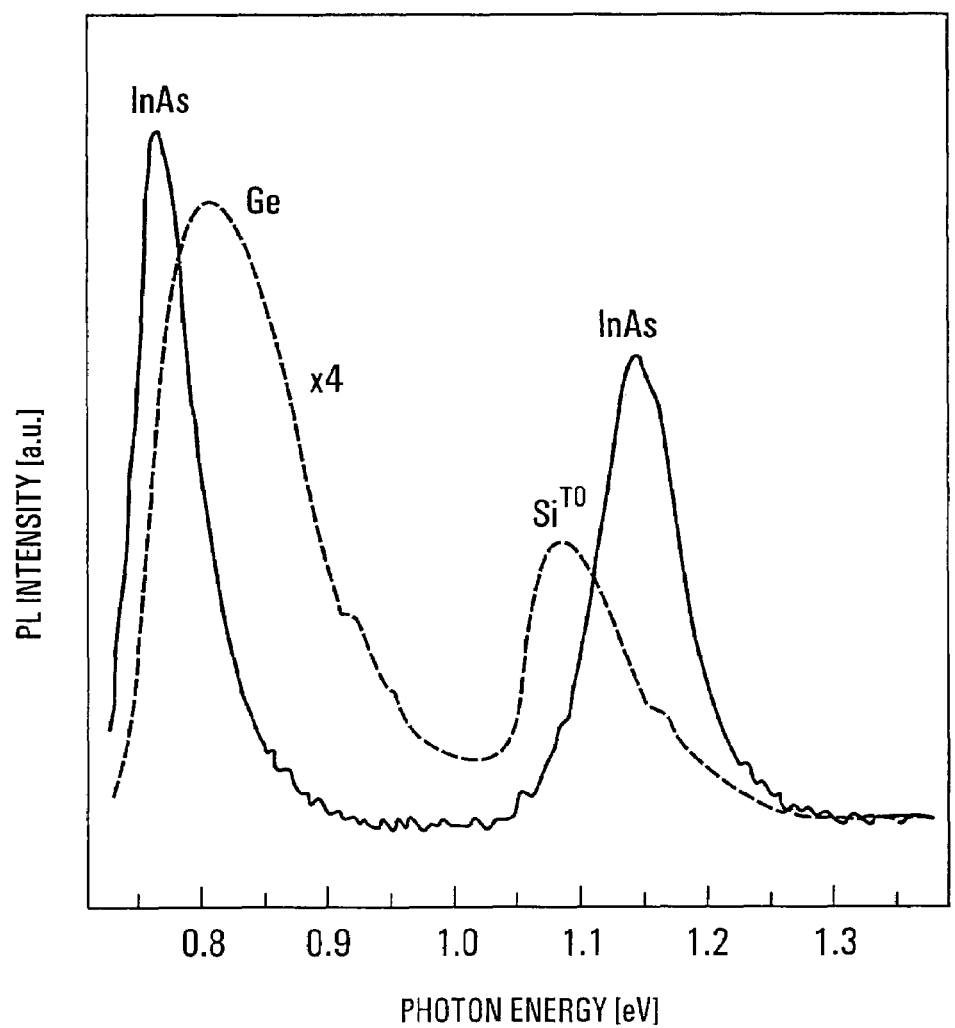
FIG. 13 is a graph showing the photoluminescent intensity as a function of photon energy for the structure in FIG. 3 in comparison with an InAs heterostructure.

FIG. 13 shows the PL intensity as a function of photon energy of the semi-conductor structure of FIG. 3 which has a superlattice of 20 alternating layers of Si and Ge, each Ge layer 16 having an average thickness of 0.8 nm, and a doping gradient in the active zone 14, in comparison with a conventional III–V heterostructure having InAs quantum dots. The solid line represents the III–V structure and the broken line represents the Si/Ge structure. The figure shows that in the near infrared wavelength region the PL intensity of the III–V structure is only slightly more than four times that of the Si/Ge structure. This verifies the extremely high recombination efficiency of the Si/Ge structure of the invention caused by the direct recombination process due to the miniband for the electrons. The graph also indicates the applicability of the structure in the area of telecommunication and fiber optics.

The preferred embodiment of the semiconductor structure of the invention comprises a cladding layer 26 and an active zone 14 of n-type conductivity formed on a base layer 10 of p-type conductivity. However, it is noted that, in principle, it is also possible to design a structure comprising a cladding layer of p-type conductivity and a base layer of n-type conductivity. The active zone might then be intrinsic or of p-type conductivity. In this case, boron or indium would be suitable dopants for p-type doping of the cladding layer and the active zone.

In the following the method of manufacturing the semi-conductor structure of FIG. 3 will be explained. The Si buffer layer 12, the Ge and Si layers 16, 18, the Si barrier layer 24, and the cladding layer 26 are epitaxially grown in sequence on a Si substrate wafer 10 by a molecular beam epitaxy (MBE) method in a MBE apparatus known in the art.

Figure 14:
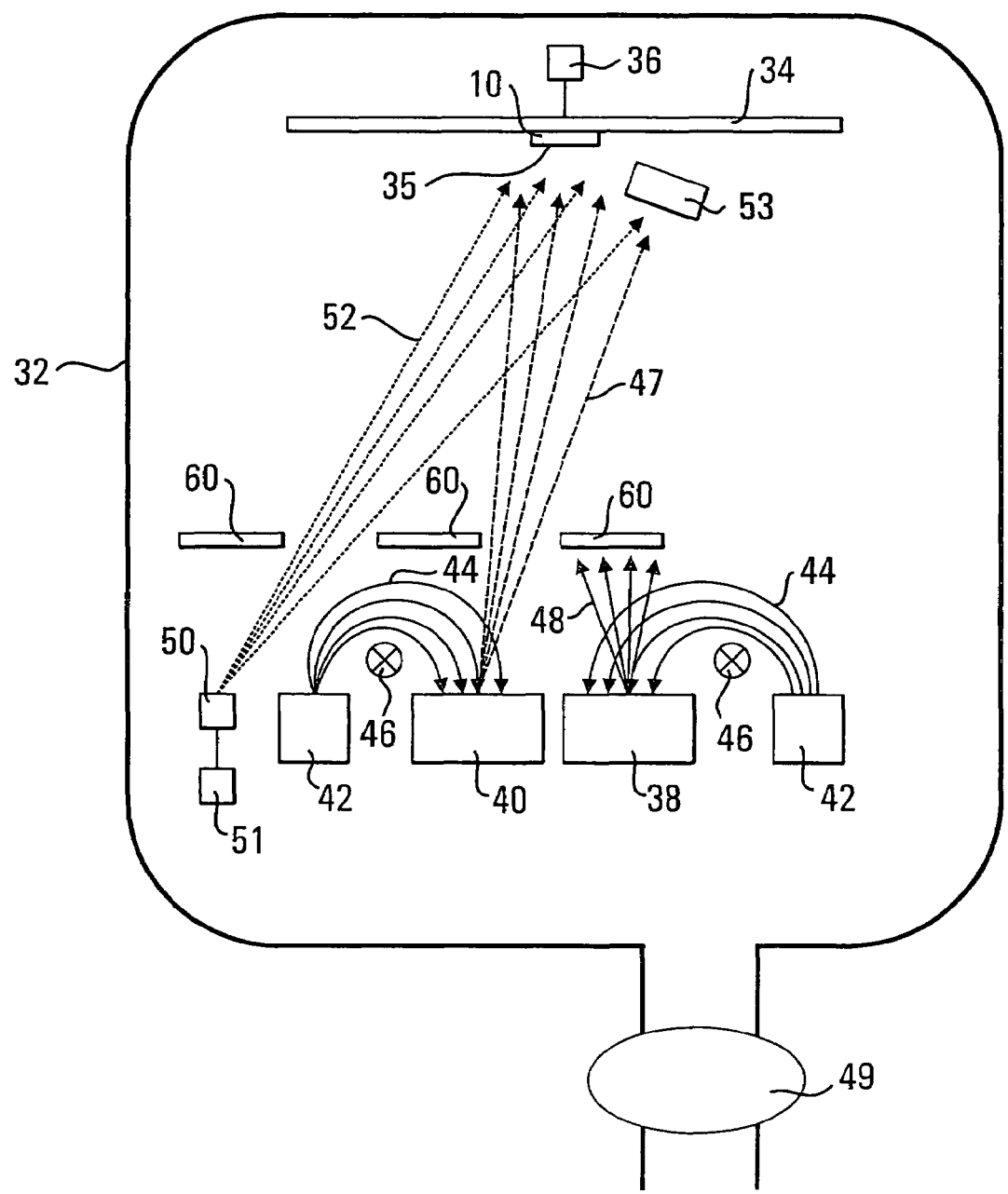
FIG. 14 schematically shows a molecular beam epitaxy (MBE) apparatus for use in the method of the invention.

The MBE apparatus shown in FIG. 14 comprises a vacuum chamber 32. Inside the chamber 32 there is provided a sample holder 34 for holding the substrate wafer 10 of at least one sample 35 to be grown. A heating means 36 is coupled to the sample holder 34 for heating the substrate wafer 10 to a temperature in the range of 400° C. to 650° C. and preferably between 425° C. and 550° C. during growth of the aforementioned layers. This temperature is high enough to anneal point defects occurring during layer growth and at the same time presents minimum thermal stress on the semiconductor structure to be grown. Hence, an in-situ annealing is carried out such that no additional annealing step has to be performed after completion of the growth of the structure.

At a distance from the sample holder 34 there is a crucible 38 containing Si and a crucible 40 containing Ge. Each crucible 38, 40 is provided with an electron source 42. Electrons 44 emitted from the electron sources 42 are deflected by a magnetic field 46 onto the material in their respective crucibles 38, 40 and introduce sufficient energy into the material contained in the respective crucibles 38, 40 that source material is melted. Evaporated silicon or germanium molecules and/or atoms 47, 48 drift through the chamber towards the sample holder 34 and are deposited on the sample 35. The flux of evaporated Si 47 and Ge 48 towards the sample 35 is controlled by shutters 60. During layer growth the pressure in the chamber is controlled by a vacuum pump 49 such that the atoms and/or molecules drift toward the sample 35 without experiencing any collisions.

In addition to the Si and Ge crucibles 38, 40 dopant material, preferably antimony (Sb), is present in the chamber in the form of a pellet 50. A heating means 51 is coupled to the pellet 50 for heating the pellet 50. Depending on the temperature of the pellet 50, pellet material 52 is evaporated in an amount resulting in the desired dopant density in the layer grown. In the embodiment described here, the Sb is evaporated simultaneously to the evaporation of the Si during growth of the Si spacer layers 18 of the active zone 14, with the amount of evaporated antimony 52 increasing with every Si layer 18 grown. The flux of evaporated Sb 52 is also controlled by a shutter 60.

The antimony is predominantly incorporated in the Si layers 18. However, a portion of the dopant introduced in the Si spacer layers 18 also diffuses into the underlying Ge layers 16. As a result, a continuously increasing doping density is obtained across the active zone 14 in the direction of growth. The lowest doping density of Sb in the active zone 14 is $5 \times 10^{16}$ cm$^{-3}$ and the highest density is $10^{18}$ cm$^{-3}$.

The flux of electrons 44 melting the germanium source material is set such that a growth rate of the Ge layers 16 at least 0.02 nm/s is achieved. In MBE, this is an extremely high growth rate and it is not believed that Ge growth rates significantly higher than 2 nm/s will be feasible. The flux of electrons melting the Si source material is set such that the growth rates of the Si spacer layers 18 and of the cladding layer 26 are at least 0.05 nm/s. This is also an extremely high growth rate and it is not believed that Si growth rates significantly higher than 4 nm/s will be feasible.

These high growth rates reduce the total process time of manufacturing the semiconductor structure of FIG. 3, preventing unwanted interdiffusion of the different materials. The high growth temperature moreover simultaneously aids the healing of any lattice defects that may occur. Lattice defects are particularly problematic because they lead to undesired non-radiating recombination of holes and electrons. It is particularly favourable that the growth of Ge islands 20 is enhanced in the Ge layers 16 of the active zone 14 as a result of these high growth rates. This leads to the formation of morphologically flat quantum dots for the holes interacting with the miniband for the electrons due to the superlattice being enhanced, thereby increasing the recombination efficiency and, thus, the PL intensity of the emitter.

The growth time of each Ge layer 16 is set such that an average thickness of 0.8 nm is deposited on the sample 35. As has been explained with reference to FIGS. 4 and 5, due to Stranski-Krastanov growth the thickness of the Ge layers 16 is not uniform but Ge islands 20 surrounded by a thin wetting layer 22 of germanium are formed. In this context, the "average thickness" of a grown layer is merely a measure for the total amount of material deposited and corresponds to the amount of material deposited in a layer of respective uniform thickness.

The average thickness of each grown layer is determined by measuring the thickness of material deposited on a measuring device 53 which is arranged close to the substrate holder 34 in the MBE chamber 32.

Figure 15:
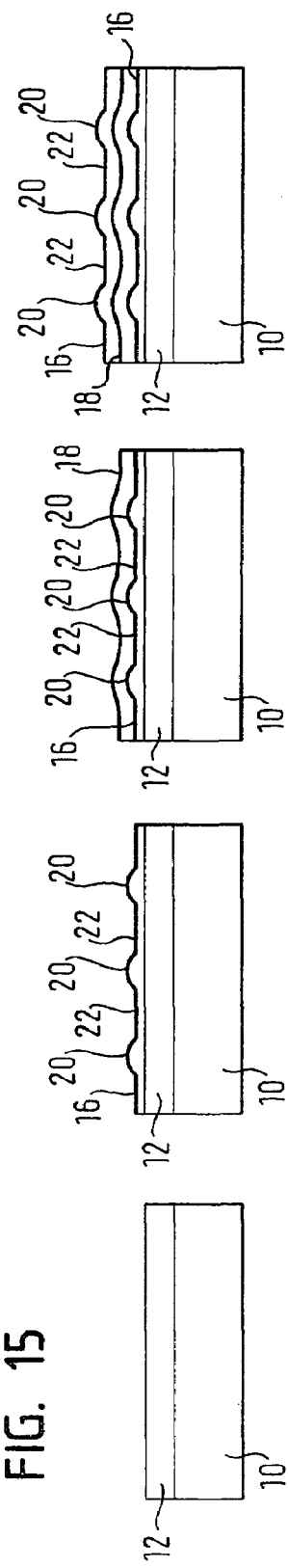
FIG. 15 schematically shows a process of growing Ge islands on Si due to inherent stress caused by the lattice misfit of Ge on Si.

FIG. 15 shows the creation of Ge islands 20 in the semiconductor structure of FIG. 3. A Si buffer layer 12 is grown on a p-doped (100) silicon substrate wafer 10. A first Ge layer 16 is then grown on buffer layer 12. Due to inherent stress as a result of lattice misfit of the Ge layer 16 and the Si buffer layer 12, regularly spaced apart islands 20 of germanium are formed in the Ge layer 16. The lateral arrangement of the Ge islands 20 can be influenced to a certain extent by the choice of growth parameters, in particular by the growth rate and the substrate temperature. On the Ge layer 16 a Si spacer layer 18 is grown. This Si layer 18 is not thick enough to even out the irregular thickness of the Ge layer 16 due to the Ge islands 20. Then another Ge layer 16 is grown on the Si spacer layer 18. Again Ge islands 16 are formed in this second Ge layer 16, with the Ge islands 20 of the second Ge layer 16 being aligned in the direction of growth with the islands 20 of the first Ge layer 16.

Figure 16:
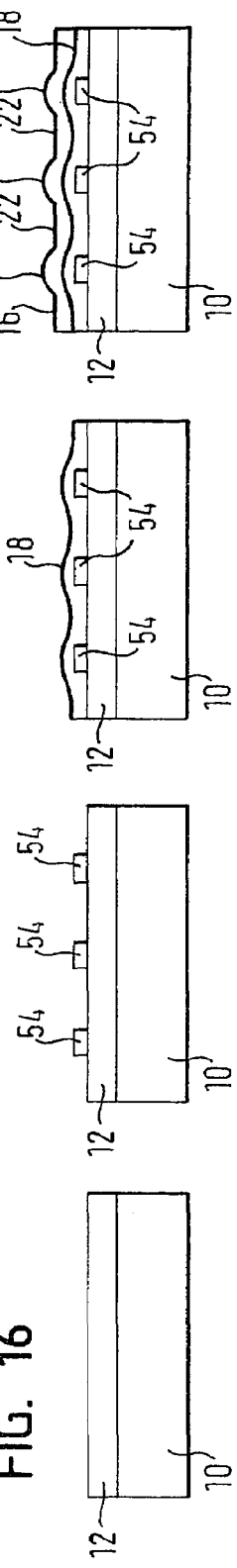
FIG. 16 schematically shows a process of defining Ge islands on Si by means of electron beam photolithography.

FIG. 16 shows a procedure of creating Ge islands 20 having a defined lateral arrangement in the active zone 14. Instead of creating Ge islands 20 due to inherent stress in the first Ge layer 16 grown on the Si buffer layer 12, defined regions 54 of germanium are formed by first subjecting the Si layer 12 to electron photolithography to leave Si areas exposed on which germanium can be epitaxially deposited, e.g. by MBE. Then a first Si spacer layer 18 is grown on the Si buffer layer 12 thereby covering the defined regions 54 of germanium. The Ge regions 54 act as growth seeds for Ge islands 20 in the Ge layers 16 that are subsequently grown on the Si spacer layers 18 and there subsequently grown Ge layers include Ge islands in a Ge wetting layer.

Figure 17:
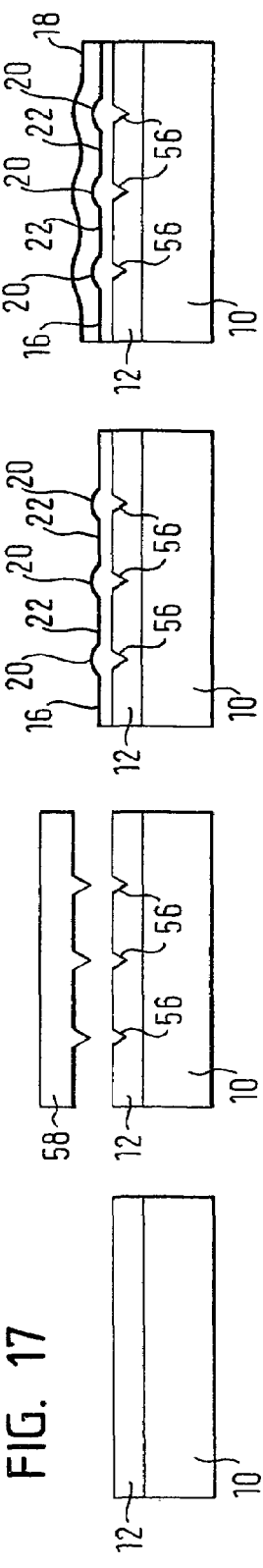
FIG. 17 schematically shows a process of generating Ge islands on growth seeds in the form of nanoindentations caused by a nanoimprint technique.

An alternative process of generating Ge islands 20 having a defined lateral arrangement is shown in FIG. 17. The Si buffer layer 12 is provided with nanoindentations 56 laterally arranged in a defined pattern by means of a nanoimprint device 58, e.g. as described in copending German patent application 10207952.8 of Feb. 25, 2002 the content of which is incorporated herein by reference. The nanoindentations 56 serve as growth seeds for Ge islands 20 in the first Ge layer 16 of the active zone 14 formed on the Si buffer layer 12. Hence, in this way the Ge islands 20 can be laterally arranged in a predetermined pattern.

In each of the methods shown in FIGS. 15 to 17, the process of growing alternating Ge layers 16 and Si spacer layers 18 is repeated until a total of about 40 layers of Ge and Si have been grown, i.e. 20 layers of Ge and 20 layers of Si. As a result, an undulation of the active zone 14 is formed, as is best seen in FIG. 4. Hence, a superlattice having a miniband for the electrons and well defined quantum dots for the holes is generated, resulting in direct transition behaviour of the Si/Ge structure of the invention and, therefore, resulting in high recombination efficiency and excellent photoluminescent intensity in the near infrared wavelength range of 1.3 μm to 1.6 μm.

The invention claimed is:

1. A semiconductor structure for use in the near infrared region, preferably in the range from 1.3 to 1.6 μm, said structure comprising:
    an active zone consisting of a plurality of epitaxially grown alternating layers of Si and Ge which form a superlattice,
    a base layer of a first conductivity type disposed on one side of said active zone,
    a cladding layer of the opposite conductivity type to the base layer, the cladding layer being provided on the opposite side of said active zone from said base layer, wherein the Ge layers of the active zone each comprise a relatively thin layer of Germanium material and a plurality of spaced apart islands or accumulations of Germanium, each island having a relatively greater thickness than said thin layer, said islands forming quantum dots providing quantized energy levels for holes, and wherein the thickness of each silicon layer of said active zone is less than 5 nm, so that said holes are located in quantized energy levels associated with a valance band and electrons are localized in a miniband associated with the conduction band and resulting from the superlattice structure such that a direct transition between said miniband and said valence band is possible for charge carriers and light emission is based upon interband transitions.

2. The semiconductor structure in accordance with claim 1, wherein said active zone has a first side adjacent said base layer and a second side adjacent to said cladding layer and wherein a dopant material is incorporated into the alternating layers of the active zone to generate a highest doping density at one of said first and second sides and a lowest doping density at the other one of said first and second sides and a doping gradient in said active zone between said first and second sides.

3. The semiconductor structure in accordance with claim 2, wherein at least one barrier layer is provided between one of said first and second sides of said active zone at which said highest doping density is present and the respective one of said base layer and said cladding layer.

4. The semiconductor structure in accordance with claim 1, wherein the substantially regularly spaced apart islands of each Ge layer are aligned in the direction of epitaxial growth with the islands of the other Ge layers.

5. The semiconductor structure in accordance with claim 1, wherein the germanium layers each have an average thickness in the range between 0.7 nm and 0.9 nm.

6. The semiconductor structure in accordance with claim 1, wherein said base layer comprises silicon.

7. The semiconductor structure in accordance with claim 3, wherein said barrier layer comprises at least one of intrinsic silicon and doped silicon and one of an intrinsic silicon-rich alloy of silicon and germanium and doped silicon-rich alloy of silicon and germanium.

8. The semiconductor structure in accordance with claim 2, wherein the highest doping density in the active zone is about $10^{18}$ cm$^{-3}$.

9. The semiconductor structure in accordance with claim 2, wherein the lowest doping density in the active zone is about is $5 \times 10^{16}$ cm$^{-3}$.

10. The semiconductor structure in accordance with claim 2, wherein the dopant is one of Sb and P for n-type Si and one of B and In for p-type Si.

11. The semiconductor structure in accordance with claim 1, wherein said active zone comprises at least 12 alternating layers.

12. The semiconductor structure in accordance with claim 1, wherein said active zone comprises not more than 30 alternating layers.

13. The semiconductor structure in accordance with claim 1, wherein said active zone comprises from 15 to 25 alternating layers.

14. The semiconductor structure in accordance with claim 1, wherein the lateral germanium island density lies in the range of $10^{10}$ to $10^{11}$ cm$^{-2}$.

* * * * *